United States Patent
Liou et al.

(10) Patent No.: US 9,466,564 B1
(45) Date of Patent: Oct. 11, 2016

(54) SEMICONDUCTOR DEVICE AND METHOD FOR FABRICATING THE SAME

(71) Applicant: UNITED MICROELECTRONICS CORP., Hsin-Chu (TW)

(72) Inventors: En-Chiuan Liou, Tainan (TW);
Chih-Wei Yang, Kaohsiung (TW);
Chih-Sen Huang, Tainan (TW);
Yu-Cheng Tung, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/692,762

(22) Filed: Apr. 22, 2015

(30) Foreign Application Priority Data

Mar. 26, 2015 (TW) .............................. 104109776 A (51) Int. Cl.
| | |
|---|---|
| *H01L 29/66* | (2006.01) |
| *H01L 29/78* | (2006.01) |
| *H01L 29/788* | (2006.01) |
| *H01L 23/522* | (2006.01) |
| *H01L 21/033* | (2006.01) |
| *H01L 21/768* | (2006.01) |
| *H01L 21/311* | (2006.01) |
| *H01L 21/3105* | (2006.01) |

(52) U.S. Cl.
CPC ....... *H01L 23/5226* (2013.01); *H01L 21/0332* (2013.01); *H01L 21/0337* (2013.01); *H01L 21/31051* (2013.01); *H01L 21/31144* (2013.01); *H01L 21/76897* (2013.01)

(58) Field of Classification Search
CPC .................... H01L 21/76897; H01L 21/0337; H01L 21/31051; H01L 21/823431; H01L 23/5226; H01L 21/02642; H01L 21/0332; H01L 21/0465; H01L 27/14614; H01L 21/32139; H01L 21/31144; H01L 21/84; H01L 21/845
See application file for complete search history.

(56) References Cited

U.S. PATENT DOCUMENTS

| | | |
|---|---|---|
| 5,960,318 A | 9/1999 | Peschke et al. |
| 2015/0035074 A1 | 2/2015 | Obradovic et al. |
| 2015/0041868 A1 | 2/2015 | Cheng et al. |
| 2015/0187896 A1* | 7/2015 | Kamineni ......... H01L 29/41791 257/288 |

* cited by examiner

*Primary Examiner* — Jasmine Clark
(74) *Attorney, Agent, or Firm* — Winston Hsu; Scott Margo (57) ABSTRACT

A semiconductor device is disclosed. The semiconductor device includes: a substrate having a gate structure thereon and a first interlayer dielectric (ILD) layer surrounding the gate structure; a first hard mask on the gate structure; and a second hard mask on the gate structure, wherein the first hard mask is adjacent to two sides of the second hard mask and the first hard mask and the first hard mask comprises silicon nitride.

11 Claims, 7 Drawing Sheets

SEMICONDUCTOR DEVICE AND METHOD FOR FABRICATING THE SAME

BACKGROUND OF THE INVENTION

1. Field of the Invention

The invention relates to a semiconductor device and fabrication method thereof, and more particularly, to an approach of forming a two-layered hard mask on top of gate structure during self-aligned contact (SAC) process.

2. Description of the Prior Art

In current semiconductor industry, polysilicon has been widely used as a gap-filling material for fabricating gate electrode of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

In current fabrication of high-k metal gate transistors, two photo-etching processes are usually conducted to form contact plugs connecting gate structure and source/drain regions during self-aligned contacts (SAC) process. Since the hard mask above gate structure is typically composed of one single material, part of the hard mask is easily removed during formation of contact plugs so that contact plug connected to the gate structure would contact the contact plug connected to the source/drain region and results in short circuit. Hence how to improve this issue has become an important task in this field.

SUMMARY OF THE INVENTION

According to a preferred embodiment of the present invention, a method for fabricating semiconductor device is disclosed. The method includes the steps of: providing a substrate having a gate structure thereon and a first interlayer dielectric (ILD) layer surrounding the gate structure; removing part of the gate structure; forming a first mask layer on the first ILD layer and the gate structure; removing the first mask layer on the first ILD layer and part of the first mask layer on the gate structure for forming a first hard mask on the gate structure; forming a second mask layer on the first ILD layer, the first hard mask, and the gate structure; and planarizing the second mask layer to form a second hard mask on the gate structure, wherein the top surfaces of the first hard mask, the second hard mask, and the first ILD layer are coplanar.

According to another aspect of the present invention, a semiconductor device is disclosed. The semiconductor device includes: a substrate having a gate structure thereon and a first interlayer dielectric (ILD) layer surrounding the gate structure; a first hard mask on the gate structure; and a second hard mask on the gate structure, wherein the first hard mask is adjacent to two sides of the second hard mask and the first hard mask and the first hard mask comprises silicon nitride.

According to another aspect of the present invention, a semiconductor device is disclosed. The semiconductor device includes: a substrate having a gate structure and a first ILD layer surrounding the gate structure; a first hard mask on the gate structure; and a second hard mask on the gate structure, wherein the first hard mask is adjacent to two sides of the second hard mask and the first hard mask and the second hard mask both contacting the gate structure directly.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
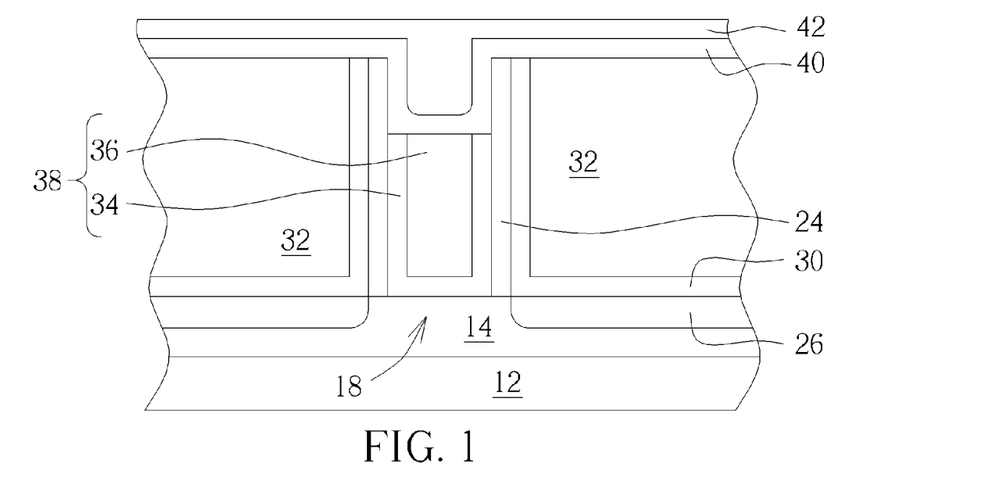
FIGS. 1-3 illustrate a method for fabricating semiconductor device according to a first embodiment of the present invention.
Figure 2:
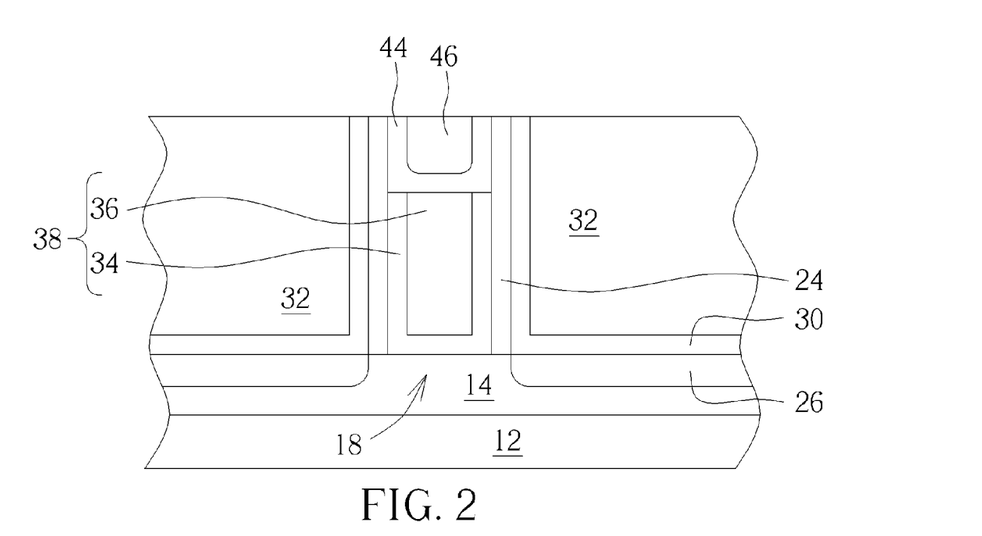
Figure 3:
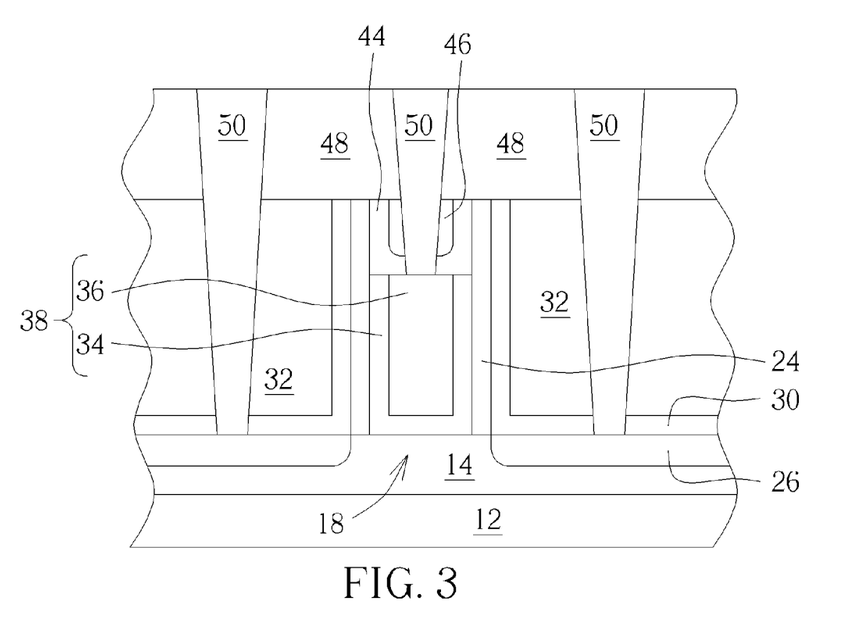

Referring to FIGS. 1-3, FIGS. 1-3 illustrate a method for fabricating semiconductor device according to a first embodiment of the present invention. As shown in FIG. 1, a substrate 12, such as a silicon substrate or silicon-on-insulator (SOI) substrate is provided, and a transistor region, such as a PMOS region or a NMOS region is defined on the substrate 12. At least a first fin-shaped structure 14 and an insulating layer are formed on the substrate 12, in which the bottom of the fin-shapes structure 14 is preferably enclosed by the insulating layer preferably composed of silicon oxide to form a shallow trench isolation (STI). A gate structure 18 is formed on part of the fin-shaped structure 14.

The formation of the fin-shaped structure 14 could be accomplished by first forming a patterned mask (now shown) on the substrate, 12, and an etching process is performed to transfer the pattern of the patterned mask to the substrate 12. Next, depending on the structural difference of a tri-gate transistor or dual-gate fin-shaped transistor being fabricated, the patterned mask could be stripped selectively or retained, and deposition, chemical mechanical polishing (CMP), and etching back processes are carried out to form a STI surrounding the bottom of the fin-shaped structure 14. Alternatively, the formation of the fin-shaped structure 14 could also be accomplished by first forming a patterned hard mask (not shown) on the substrate 12, and then performing an epitaxial process on the exposed substrate 12 through the patterned hard mask to grow a semiconductor layer. This semiconductor layer could then be used as the corresponding fin-shaped structure 14. In another fashion, the patterned hard mask could be removed selectively or retained, and deposition, CMP, and then etching back could be used to form a STI surrounding the bottom of the fin-shaped structure 14. Moreover, if the substrate 12 were a SOI substrate, a patterned mask could be used to etch a semiconductor layer on the substrate until reaching a bottom oxide layer underneath the semiconductor layer to form the corresponding fin-shaped structure. If this means is chosen the aforementioned steps for fabricating the STI could be eliminated.

The fabrication of the gate structure 18 could be accomplished by a gate first process, a high-k first approach from gate last process, or a high-k last approach from gate last process. Since this embodiment pertains to a high-k first approach, dummy gate (not shown) composed of high-k dielectric layer and polysilicon material could be first formed on the fin-shaped structure 14 and the STI, and a spacer 24 is formed on the sidewall of the dummy gate. A source/drain region 26 and epitaxial layer (not shown) are then formed in the fin-shaped structure 14 and/or substrate 12 adjacent to two sides of the spacer 24, a contact etch stop layer (CESL) 30 is formed on the dummy gate, and an interlayer dielectric (ILD) layer 32 composed of tetraethyl orthosilicate (TEOS) is formed on the CESL 30.

Next, a replacement metal gate (RMG) process could be conducted to planarize part of the ILD layer 32 and CESL 30 and then transforming the dummy gate into a metal gate. The RMG process could be accomplished by first performing a selective dry etching or wet etching process, such as using etchants including ammonium hydroxide (NH$_4$OH) or tetramethylammonium hydroxide (TMAH) to remove the polysilicon layer from dummy gate for forming a recess (not shown) in the ILD layer 32. Next, a conductive layer including at least a U-shaped work function metal layer 34 and a low resistance metal layer 36 is formed in the recess, and a planarizing process is conducted thereafter so that the surfaces of the U-shaped work function metal layer 34 and low resistance metal layer 36 are even with the surface of the ILD layer 32. This forms a gate electrode 38 of the gate structure 18.

In this embodiment, the work function metal layer 34 is formed for tuning the work function of the later formed metal gates to be appropriate in an NMOS or a PMOS. For an NMOS transistor, the work function metal layer 34 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 34 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 34 and the low resistance metal layer 36, in which the material of the barrier layer may include titanium (Ti), titanium nitride (TiN), tantalum (Ta) or tantalum nitride (TaN). Furthermore, the material of the low-resistance metal layer 36 may include copper (Cu), aluminum (Al), titanium aluminum (TiAl), cobalt tungsten phosphide (CoWP) or any combination thereof. Since the process of using RMG process to transform dummy gate into metal gate is well known to those skilled in the art, the details of which are not explained herein for the sake of brevity.

After forming the gate structure 18, part of the gate electrode 38, such as part of work function metal layer 34 and low resistance metal layer 36 could be removed to form a recess between the spacer 24, and a first mask layer 40 and a second mask layer 42 are sequentially deposited on the ILD layer 32, CESL 30, spacer 24, and gate electrode 38.

Next, as shown in FIG. 2, a CMP process is conducted to planarize part of the second mask layer 42 and part of the first mask layer 40 for forming a first hard mask 44 and a second hard mask 46 on the gate electrode 38, in which the top surfaces of the first hard mask 44, second hard mask 46, spacer 24, CESL 30, and ILD layer 32 are coplanar.

In this embodiment, the first hard mask 44 and second hard mask 46 are preferably composed of different material such as the first hard mask 44 is composed of silicon nitride while the second hard mask 46 is composed of silicon oxide, but not limited thereto. Viewing from a structural perspective, the first hard mask 44 is preferably U-shaped and contacting the gate electrode 38 directly while the second hard mask 46 is disposed on the first hard mask 44 without contacting the gate electrode 38.

Next, as shown in FIG. 3, another ILD layer 48 is formed on the first hard mask 44, second hard mask 46, spacer 24, CESL 30, and ILD layer 32, and a contact plug formation is conducted to form plurality of contact plugs 50 electrically connected to the gate electrode 38 and source/drain region 26. In this embodiment, the contact plugs 50 could be formed by first using a photo-etching process to remove part of the ILD layer 48 directly above the gate electrode 38 and part of or all of the second hard mask 46 to expose the first hard mask 44 surface, and then using another etching process to remove part of the hard mask 44 so that the remaining first hard mask 44 is only formed against sidewalls of the recess like a spacer. This exposes the top surface of the gate electrode 38 and forms a contact hole. Next, aforementioned photo-etching process is repeated to form two additional contact holes exposing the source/drain region 26, metals are deposited into the contact holes, and CMP process is conducted to remove part of the metal material or even part of the ILD layer 48 to form contact plugs 50 electrically connected the gate electrode 38 and source/drain region 26. This completes the fabrication of semiconductor device according to a first embodiment of the present invention.

Figure 4:
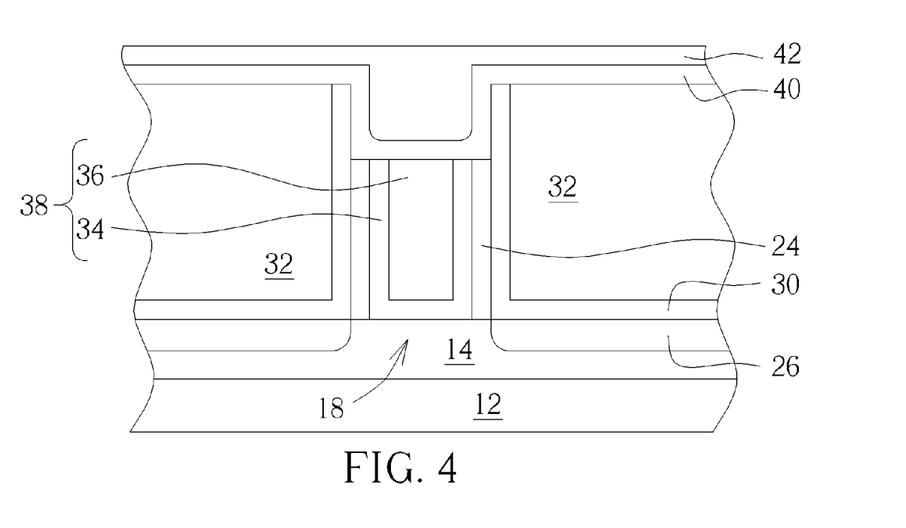
FIGS. 4-6 illustrate a method for fabricating semiconductor device according to a second embodiment of the present invention.
Figure 5:
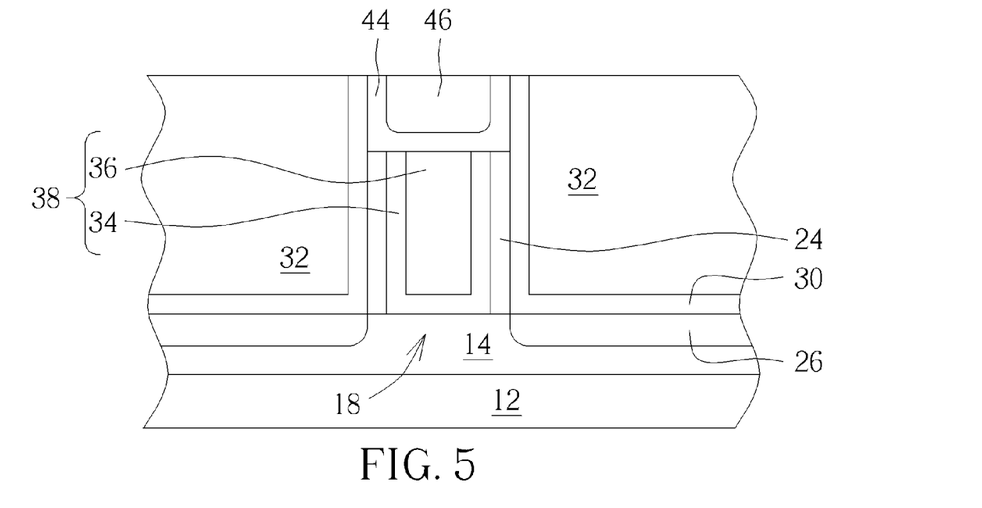
Figure 6:
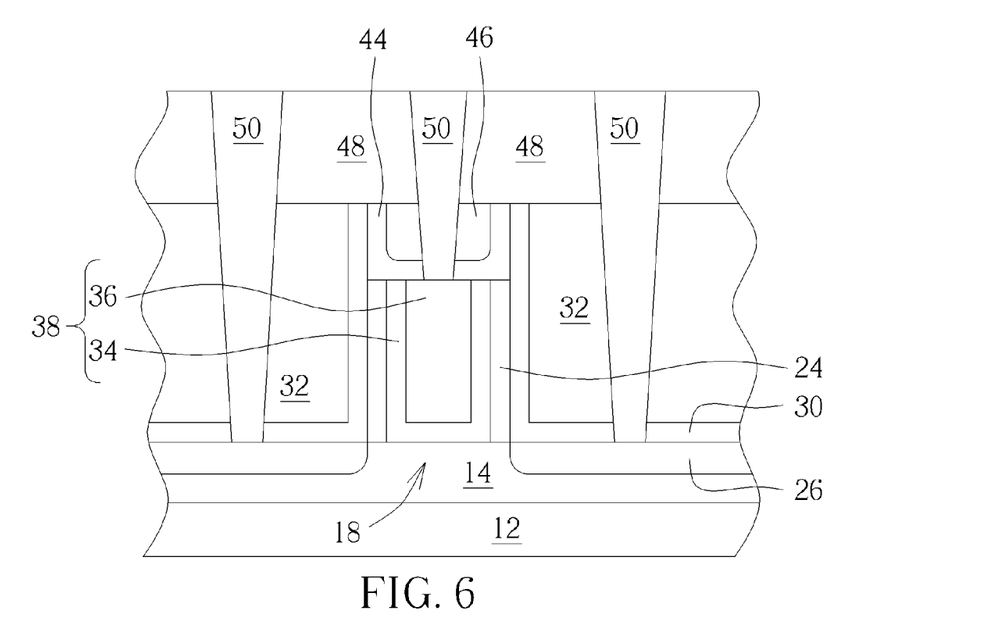

Referring to FIGS. 4-6, FIGS. 4-6 illustrate a method for fabricating semiconductor device according to a second embodiment of the present invention. As shown in FIG. 4, after forming the gate electrode 38 composed of U-shaped metal layer 34 and low resistance metal layer 36 according to the first embodiment, it would be desirable to remove part of the gate electrode 38 and part of the spacer 24 for forming a recess within the ILD layer 32, and then form a first mask layer 40 and second mask layer 42 sequentially on the ILD layer 32, CESL 30, spacer 24, and gate electrode 38.

Next, as shown in FIG. 5, a CMP process is conducted to planarize part of the second mask layer 42 and part of the first mask layer 40 for forming a first hard mask 44 and second hard mask 46 on the spacer 24 and gate electrode 38, in which the top surfaces of the first hard mask 44, second hard mask 46, CESL 30, and ILD layer 32 are coplanar.

In this embodiment, the first hard mask 44 and second hard mask 46 are preferably composed of different material, such as the first hard mask 44 is composed of silicon nitride while the second hard mask 46 is composed of silicon oxide, but not limited thereto. Viewing from a structural perspective, the first hard mask 44 is preferably U-shaped and sitting on the gate electrode 38 and spacer 24 at the same time while the second hard mask 46 is disposed on the first hard mask 44 without contacting the gate electrode 38.

Next, as shown in FIG. 6, another ILD layer 48 is formed on the first hard mask 44, second hard mask 46, CESL 30, and ILD layer 32, and a contact plug formation is conducted to form plurality of contact plugs 50 electrically connected to the gate electrode 38 and source/drain region 26. In this embodiment, the contact plugs 50 could be formed by first using a photo-etching process to remove part of the ILD layer 48 directly above the gate electrode 38 and part of the second hard mask 46 to expose the first hard mask 44 surface, and then using another etching process to remove part of the hard mask 44. This exposes the top surface of the gate electrode 38 and forms a contact hole. Next, aforementioned photo-etching process is repeated to form two additional contact holes exposing the source/drain region 26, metals are deposited into the contact holes, and CMP process is conducted to remove part of the metal material or even part of the ILD layer 48 to form contact plugs 50 electrically connected the gate electrode 38 and source/drain region 26. This completes the fabrication of semiconductor device according to a second embodiment of the present invention.

Figure 7:
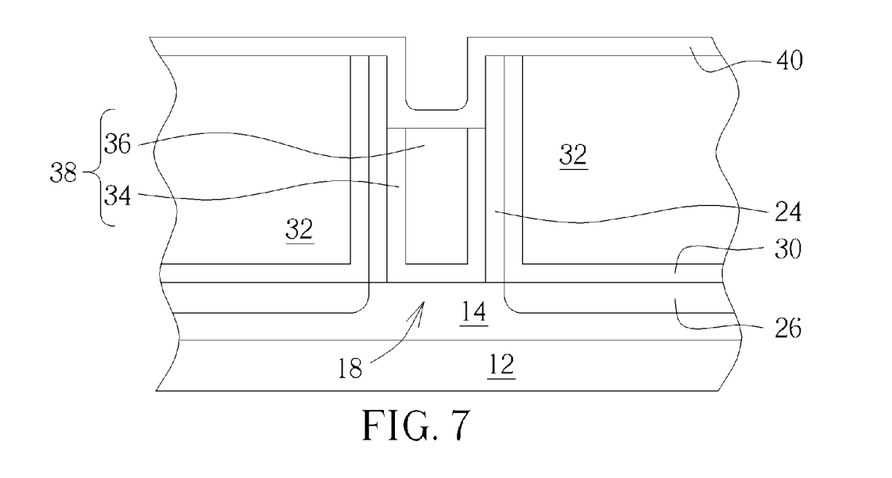
FIGS. 7-10 illustrate a method for fabricating semiconductor device according to a third embodiment of the present invention.

Referring to FIGS. 7-10, FIGS. 7-10 illustrate a method for fabricating semiconductor device according to a third embodiment of the present invention. As shown in FIG. 7, after forming the gate electrode 38 composed of U-shaped metal layer 34 and low resistance metal layer 36 according to the first embodiment, it would be desirable to remove part of the gate electrode 38 for forming a recess between the spacer 24, and then conformally form a first mask layer 40 on the ILD layer 32, CESL 30, spacer 24, and gate electrode 38.

Figure 8:
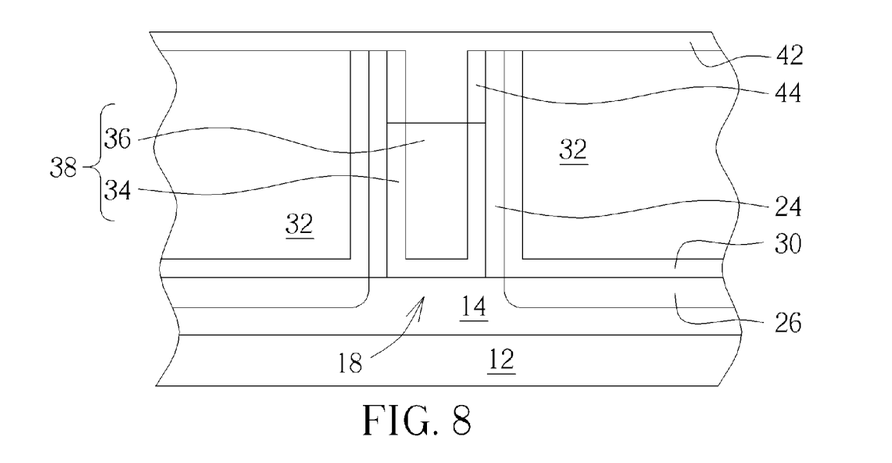

Next, as shown in FIG. 8, the first mask layer 40 atop the ILD layer 32, CESL 30, and spacer 24 and part of the first mask layer 40 on the gate electrode 38 are removed so that the remaining first mask layer 40 is only formed against the sidewalls of the recess like a spacer. This forms a first hard mask 44 on the gate electrode 38 and a second mask layer 42 is formed on the ILD layer 32, CESL 30, spacer 24, first hard mask 44, and gate electrode 38 thereafter.

Figure 9:
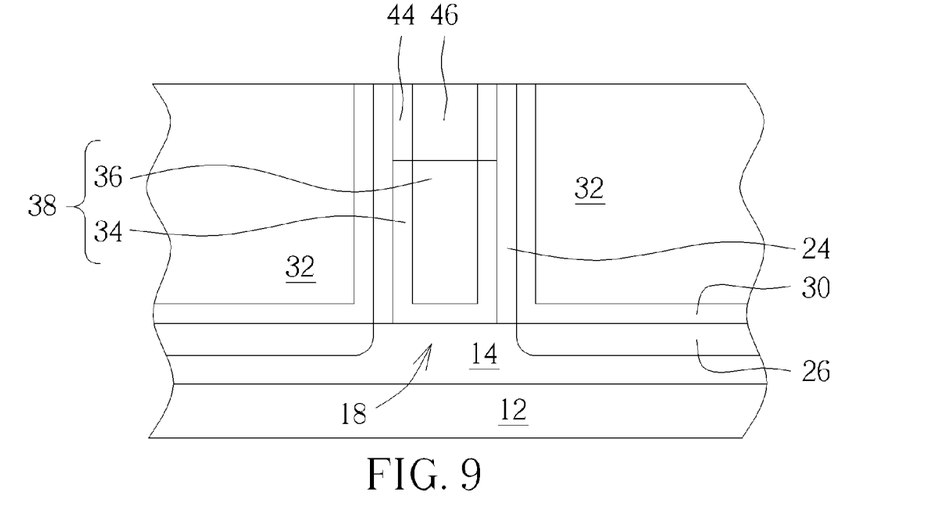

Next, as shown in FIG. 9, a CMP process is conducted to planarize part of the second mask layer 42 for forming a second hard mask 46 on the gate electrode 38 between first hard mask 44, so that the top surfaces of the first hard mask 44, second hard mask 46, spacer 24, CESL 30, and ILD layer 32 are coplanar.

In this embodiment, the first hard mask 44 and second hard mask 46 are preferably composed of different material, such as the first hard mask 44 is composed of silicon nitride while the second hard mask 46 is composed of silicon oxide, but not limited thereto. Viewing from a structural perspective, both the first hard mask 44 and second hard mask 46 are disposed on the gate electrode 38 and contacting the gate electrode 38 directly, in which the second hard mask 46 is preferably between the first hard mask 44.

Figure 10:
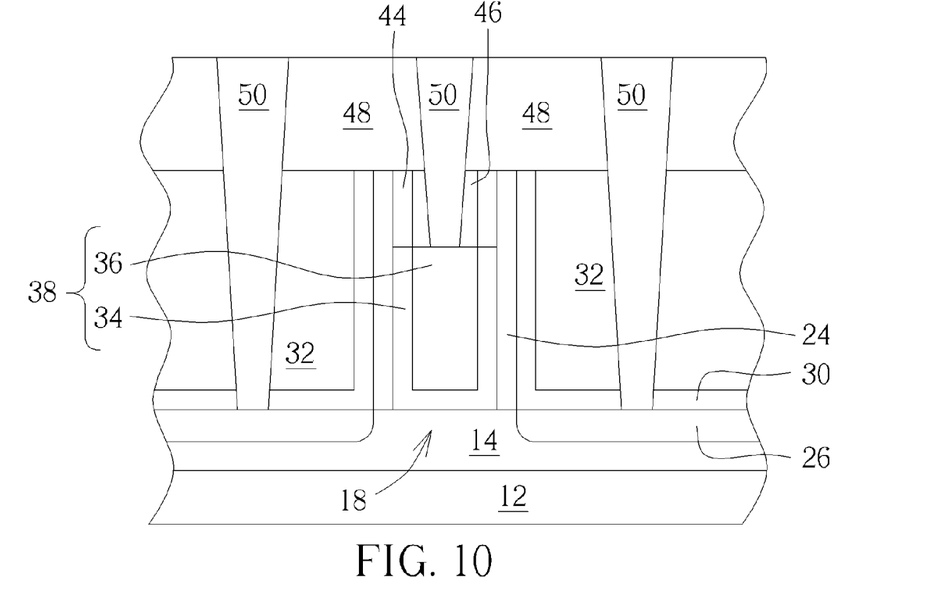

Next, as shown in FIG. 10, another ILD layer 48 is formed on the first hard mask 44, second hard mask 46, spacer 24, CESL 30, and ILD layer 32, and a contact plug formation is conducted to form plurality of contact plugs 50 electrically connected to the gate electrode 38 and source/drain region 26. In this embodiment, the contact plugs 50 could be formed by first using a photo-etching process to remove part of the ILD layer 48 directly above the gate electrode 38 and part of or all of the second hard mask 46 for forming a contact plug. In contrast to the aforementioned first embodiment and second embodiment of using two-step etching processes to remove part of second hard mask 46 and first hard mask 44 composed of different material for forming contact hole, the first hard mask 44 of this embodiment is not U-shaped and not disposed under the second hard mask 46 so that only one photo-etching process is required to form desirable contact hole for contact plug 50 afterwards. Next, aforementioned photo-etching process is repeated to form two additional contact holes exposing the source/drain region 26, metals are deposited into the contact holes, and CMP process is conducted to remove part of the metal material or even part of the ILD layer 48 to form contact plugs 50 electrically connected to the gate electrode 38 and source/drain region 26. This completes the fabrication of semiconductor device according to a third embodiment of the present invention.

Figure 11:
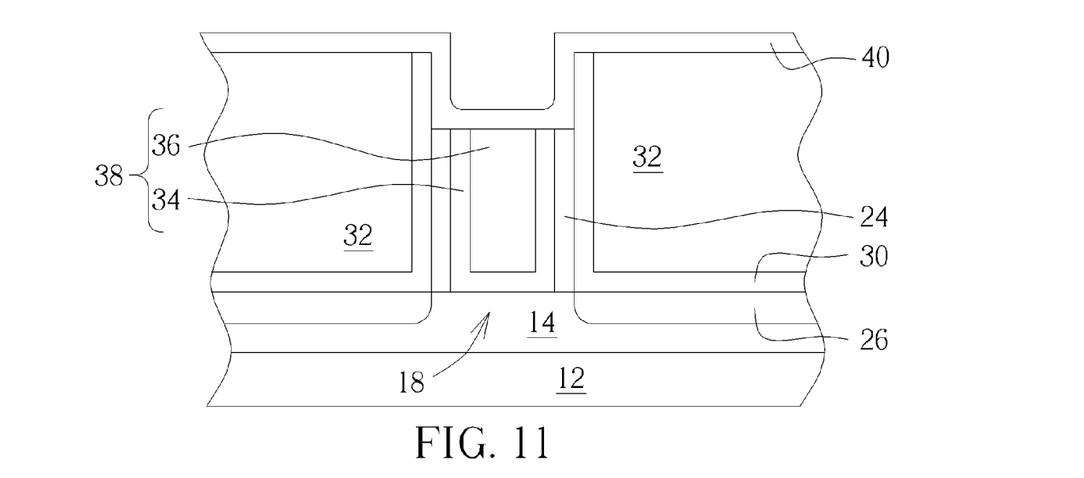
FIGS. 11-14 illustrate a method for fabricating semiconductor device according to a fourth embodiment of the present invention.

Referring to FIGS. 11-14, FIGS. 11-14 illustrate a method for fabricating semiconductor device according to a fourth embodiment of the present invention. As shown in FIG. 11, after forming the gate electrode 38 composed of U-shaped metal layer 34 and low resistance metal layer 36 according to the first embodiment, it would be desirable to remove part of the gate electrode 38 and part of spacer 24 for forming a recess between the ILD layer 32, and then conformally form a first mask layer 40 on the ILD layer 32, CESL 30, spacer 24, and gate electrode 38.

Figure 12:
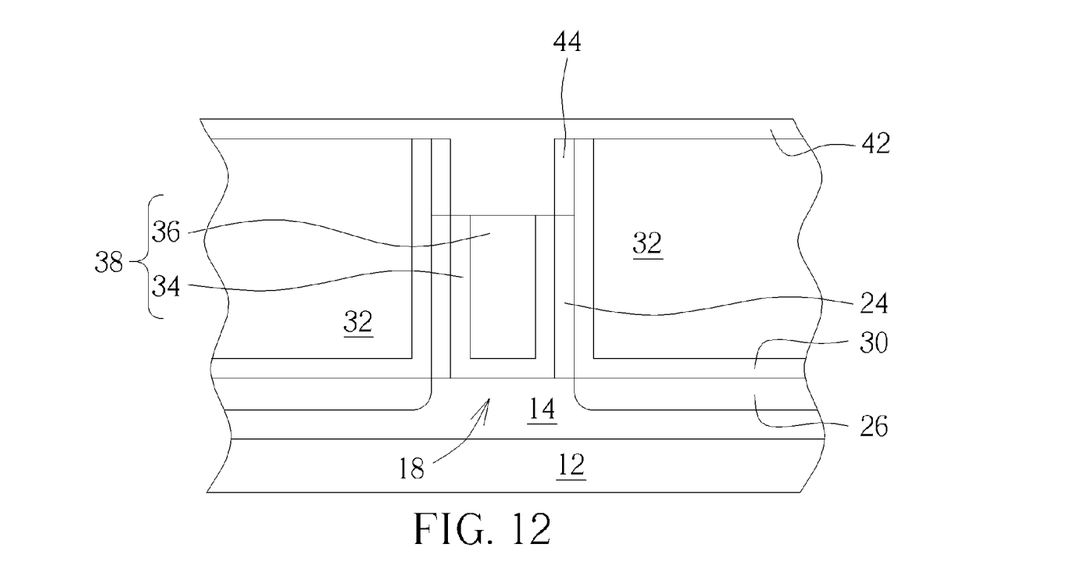

Next, as shown in FIG. 12, the first mask layer 40 atop the ILD layer 32 and CESL 30 and part of the first mask layer 40 on the gate electrode 38 are removed so that the remaining first mask layer 40 is only formed against the sidewalls of the recess like a spacer. This forms a first hard mask 44 on the spacer 24 and a second mask layer 42 is then formed on the ILD layer 32, CESL 30, first hard mask 44, and gate electrode 38 thereafter.

Figure 13:
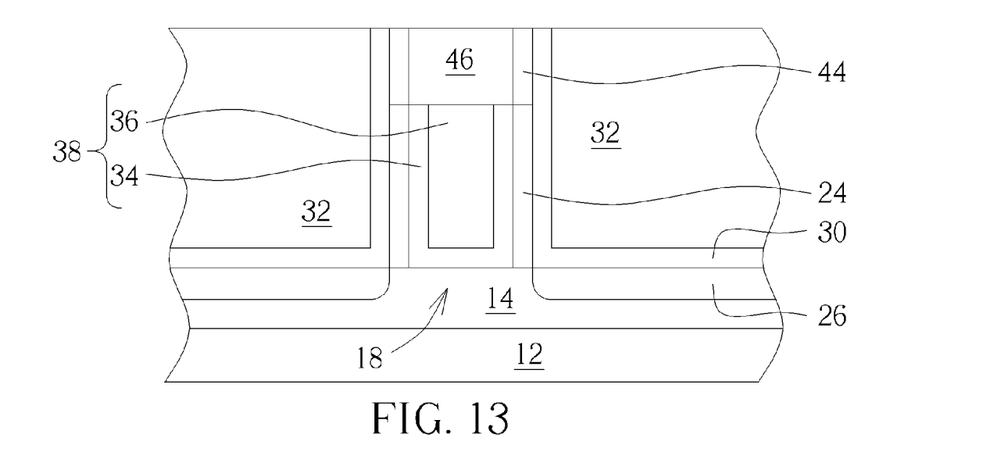

Next, as shown in FIG. 13, a CMP process is conducted to planarize part of the second mask layer 42 for forming a second hard mask 46 on the gate electrode 38, so that the top surfaces of the first hard mask 44, second hard mask 46, CESL 30, and ILD layer 32 are coplanar.

In this embodiment, the first hard mask 44 and second hard mask 46 are preferably composed of different material, such as the first hard mask 44 is composed of silicon nitride while the second hard mask 46 is composed of silicon oxide, but not limited thereto. Viewing from a structural perspective, both the first hard mask 44 and second hard mask 46 are disposed on the gate electrode 38 or more specifically, the first hard mask 44 is disposed atop the spacer 24 while the second hard mask 46 is disposed on the gate electrode 38, in which the second hard mask 46 is between the first hard mask 44.

Figure 14:
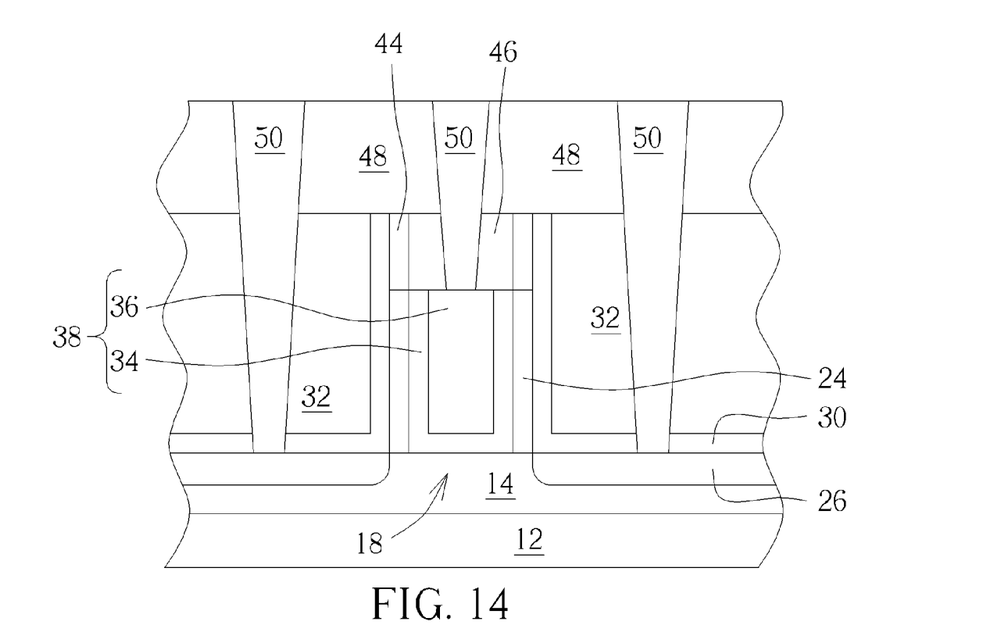

Next, as shown in FIG. 14, another ILD layer 48 is formed on the first hard mask 44, second hard mask 46, CESL 30, and ILD layer 32, and a contact plug formation is conducted to form plurality of contact plugs 50 electrically connected to the gate electrode 38 and source/drain region 26. In this embodiment, the contact plugs 50 could be formed by first using a photo-etching process to remove part of the ILD layer 48 directly above the gate electrode 38 and part of the second hard mask 46 for forming a contact plug. Similar to the third embodiment, the first hard mask 44 of this embodiment is not U-shaped and not disposed under the second hard mask 46 so that only one photo-etching process is required to form desirable contact hole for contact plug 50 afterwards. Next, aforementioned photo-etching process is repeated to form two additional contact holes exposing the source/drain region 26, metals are deposited into the contact holes, and CMP process is conducted to remove part of the metal material or even part of the ILD layer 48 to form contact plugs 50 electrically connected to the gate electrode 38 and source/drain region 26. This completes the fabrication of semiconductor device according to a fourth embodiment of the present invention.

Overall, the present invention preferably forms two hard masks on gate electrode, in which the first hard mask is disposed adjacent to at least two sides of the second hard mask while the first hard mask is composed of silicon nitride and the second hard mask is composed of silicon oxide. According to the aforementioned embodiments, the design of the first hard mask and second hard mask could include a total of four combinations, in which the first hard mask could be either U-shaped or I-shaped, or the spacer could be etched so that the first hard mask could be sitting on the spacer directly. By using the double hard mask design with first hard mask composed of silicon nitride surrounding second hard mask composed of silicon oxide, it would be desirable to prevent the contact plug electrically connected to the gate structure from contacting the contact plug connected to the source/drain region so that short circuit is minimized.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate having a gate structure thereon and a first interlayer dielectric (ILD) layer surrounding the gate structure;
   a first hard mask on the gate structure; and
   a second hard mask on the gate structure, wherein the first hard mask is adjacent to two sides of the second hard mask and the first hard mask comprises silicon nitride.

2. The semiconductor device of claim 1, wherein the gate structure comprises a gate electrode and a spacer adjacent to the gate electrode, the semiconductor device further comprises:
   the first hard mask on the gate electrode; and
   the second hard mask on the first hard mask.

3. The semiconductor device of claim 1, wherein the gate structure comprises a gate electrode and a spacer adjacent to the gate electrode, the semiconductor device further comprises:
   the first hard mask on the gate electrode and the spacer; and
   the second hard mask on the first hard mask.

4. The semiconductor device of claim 1, wherein the gate structure comprises a gate electrode and a spacer adjacent to the gate electrode, the semiconductor device further comprises:
   the first hard mask on the gate electrode; and
   the second hard mask on the gate electrode and directly contacting the gate electrode.

5. The semiconductor device of claim 1, wherein the gate structure comprises a gate electrode and a spacer adjacent to the gate electrode, the semiconductor device further comprises:
   the first hard mask on the spacer; and
   the second hard mask on the gate electrode and directly contacting the gate electrode.

6. The semiconductor device of claim 1, wherein the first hard mask comprises silicon nitride and the second hard mask comprises silicon oxide.

7. The semiconductor device of claim 1, further comprising:
   a second ILD layer on the first ILD layer, the first hard mask, and the second hard mask; and
   a contact plug passing through the second ILD layer and the second hard mask and directly contacting the gate structure.

8. The semiconductor device of claim 1, further comprising:
   a second ILD layer on the first ILD layer, the first hard mask, and the second hard mask; and
   a contact plug passing through the second ILD layer, the first hard mask, and the second hard mask and directly contacting the gate structure.

9. A semiconductor device, comprising:
   a substrate having a gate structure and a first ILD layer surrounding the gate structure;
   a first hard mask on the gate structure; and
   a second hard mask on the gate structure, wherein the first hard mask is adjacent to two sides of the second hard mask and the first hard mask and the second hard mask both contacting the gate structure directly.

10. The semiconductor device of claim 9, wherein the first hard mask comprises silicon nitride and the second hard mask comprises silicon oxide.

11. The semiconductor device of claim 9, further comprising:
   a second ILD layer on the first ILD layer, the first hard mask, and the second hard mask; and
   a contact plug passing through the second ILD layer and the second hard mask and directly contacting the gate structure.

* * * * *